United States Patent [19]
Gelbart

[11] Patent Number: 6,063,546
[45] Date of Patent: May 16, 2000

[54] METHOD FOR EXPOSING FLEXOGRAPHIC PLATES

[75] Inventor: Daniel Gelbart, Burnaby, Canada

[73] Assignee: Creo SRL, Burnaby, Canada

[21] Appl. No.: 09/339,023

[22] Filed: Jun. 23, 1999

Related U.S. Application Data

[63] Continuation-in-part of application No. 09/003,140, Jan. 6, 1998, Pat. No. 5,998,067.

[51] Int. Cl.$^7$ ........................................... G03F 9/00
[52] U.S. Cl. ................................. 430/306; 430/5
[58] Field of Search ........................... 430/306, 5

[56] References Cited

U.S. PATENT DOCUMENTS 5,213,916  5/1993  Cronin et al. ................... 430/5
5,262,275  11/1993  Fan ............................... 430/273
5,506,086  4/1996  Van Zoeren ..................... 430/201
5,725,972  3/1998  Takeshita ........................ 430/5

*Primary Examiner*—Janet Baxter
*Assistant Examiner*—Rosemary Ashton
*Attorney, Agent, or Firm*—Oyen Wiggs Green & Mutala

[57] ABSTRACT

A method for creating a flexographic printing plate includes creating a mask which has opaque and non-opaque regions. The non-opaque regions have variable optical densities. Areas of the mask corresponding to portions of the plate which will require higher exposures have lower optical densities. Areas of the mask corresponding to portions of the plate which will require lower exposures have higher optical densities. A flexographic photo-polymer printing plate is exposed through the mask. The varying optical density of the mask allows all portions of the printing plate to be exposed with a single exposure. The mask may include a thermal film which may be integral with the printing plate.

13 Claims, 4 Drawing Sheets

METHOD FOR EXPOSING FLEXOGRAPHIC PLATES

CROSS-REFERENCE TO RELATED APPLICATIONS

This is a continuation-in-part of application Ser. No. 09/003,140, now U.S. Pat. No. 5,998,067, entitled MASK FOR EXPOSING FLEXOGRAPHIC PLATES filed Jan. 6, 1998.

FIELD OF THE INVENTION

This invention relates to the printing industry. The invention relates in particular to methods for exposing photo-polymer plates for use in printing.

BACKGROUND OF THE INVENTION

One kind of printing plate comprises a layer of a photo-polymer, which may be a solid, a liquid or a gel. A mask is placed over the photo-polymer. The mask is then illuminated with intense ultraviolet light which shines through clear portions of the mask onto the photo-polymer. Those portions of the photo-polymer which are illuminated through the mask undergo a photo-chemical reaction which hardens the photo-polymer. Areas of the photo-polymer beneath opaque portions of the mask are shaded from the ultraviolet light and are not hardened. After exposure the plate can be developed. This is typically done by washing the plate to remove non-hardened parts of the photo-polymer. Other suitable methods may be used to remove the non-hardened photo-polymer to leave the printing plate with a textured surface useful for printing an image.

Shades of grey in a printed image are produced by a technique called "screening". An area on a printing plate which will print a grey shade is textured with a large number of small screen dots. During printing, each screen dot deposits a small dot of ink on the substrate. No ink is deposited on the substrate in its portions between screen dots. Different shades of grey in the final image are produced by using different sizes and densities of screendots.

The masks used in exposing photo-polymer plates are typically half tone films. Such films have become standard in the printing industry for this purpose. Each portion of a developed halftone film is in one of two states, clear or opaque. Thus both the masks used to make printing plates and the printing plates themselves are "binary" in the sense that they have no intrinsic grey scale. Each part of the mask is either clear or opaque. Each part of the surface of the textured printing plate is either raised, so that it will deposit ink on a substrate in the creation of a printed image, or not raised, so that no ink is deposited on a corresponding portion of the printed image.

A significant problem in preparing flexographic printing plates is that different areas on each flexographic printing plate require different exposures for best results. For example, where the mask has a negative area(a small opaque area surrounded by a large clear area) the printing plate is liable to be overexposed. The small opaque area of the mask should create a corresponding non-printing area on the printing plate. However, light which has entered the photo-polymer through the clear area of the mask can leak into the portion of the photo-polymer under the opaque area. If too much light leaks into the photo-polymer under the opaque area then the photo-polymer under the opaque area may become hardened. This may cause the desired non-printing portion of the printing plate to become "plugged". In extreme cases, the non-printing area may disappear entirely even though the photo-polymer under the small opaque area is shaded from direct illumination.

If a mask has "highlights" (small clear areas in a larger opaque area) then the photo-polymer beneath the clear areas may not receive sufficient exposure. This may result in the absence of desired printing areas, such as screen dots, in the finished printing plate. Many images require a masks which include both negative portions and highlights. It is not possible to provide a single exposure which will properly expose all parts of the photo-polymer plate under such a mask. The exposure latitude for flexographic printing plates is very small since any variation from the optimum exposure will either cause over exposure in negative portions or underexposure in highlights.

The problem of achieving correct exposure of a photo-polymer printing plate is well known in the printing industry. The current state of the art in dealing with such exposure problems is to expose the photo-polymer plate sufficiently to properly expose the highlights and to prevent over exposure in the negative portions of the image by placing small pieces of opaque material on top of the negative portions of the mask during the exposure and moving the opaque material around judiciously during the exposure process. This operation is time consuming and requires a skilled operator to place the pieces of opaque material in appropriate places on top of the mask and to move and remove them at appropriate points in the exposure. Another problem with current techniques is that the resolution with which an image can be imprinted on a photo-polymer printing plate is undesirably limited.

There is a need for a method which can reliably expose a complete photo-polymer printing plate with a single exposure without the intervention of a skilled operator. There is also a need for a method which can prepare flexographic plates having resolutions higher than those readily obtainable with practical current methods.

SUMMARY OF THE INVENTION

This invention provides a method for exposing a flexographic printing plate. The method allows parts of the plate having different screen densities to be properly exposed in a single exposure. The method includes providing a mask which compensates for the fact that different portions of an image should have different exposures. The method comprises providing an image to be reproduced by a printing plate, determining a first exposure to be given to first portions of the printing plate corresponding to a first area of the image and a second exposure, less than the first exposure, to be given to second portions of the printing plate corresponding to a second area of the image. The method then creates a mask. The mask has opaque areas and non-opaque areas. The non-opaque areas of the mask have a first optical density in portions of the mask corresponding to the first area of the image and a second optical density, greater than the first optical density, in portions of the mask corresponding to the second area of the image. The printing plate is then exposed to ultraviolet light through the mask.

Other features and advantages of the invention are described below.

BRIEF DESCRIPTION OF THE DRAWINGS

In drawings which illustrate non-limiting embodiments of the invention.

DETAILED DESCRIPTION

Prior Art

Figure 1:
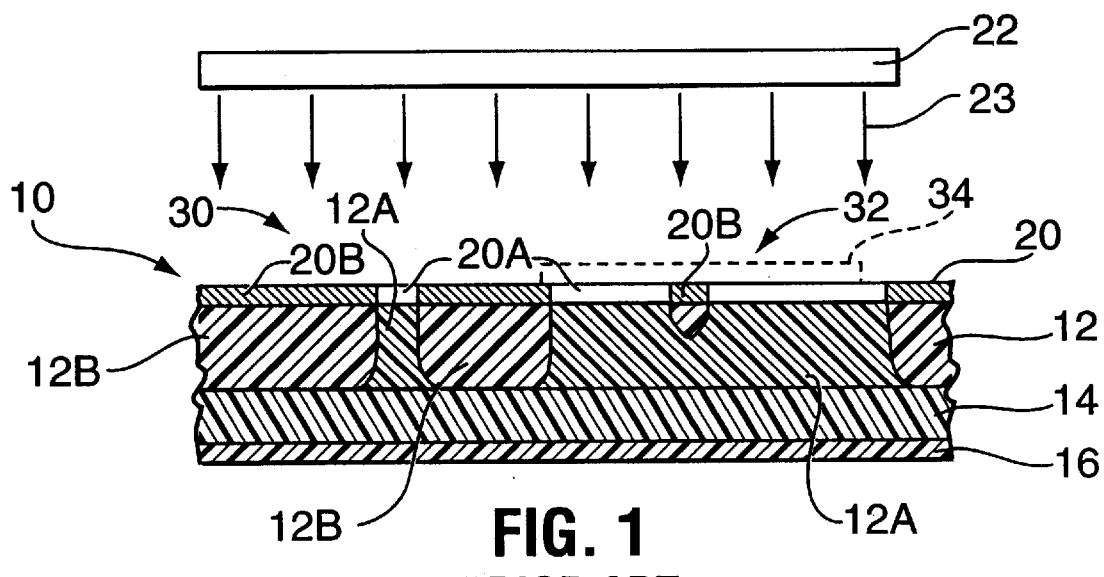
FIG. 1 is a section through a prior art flexographic printing plate and mask.

FIG. 1 shows a flexographic printing plate 10 which has a photo-polymerizable layer 12 and an elastomeric layer 14 on a backing 16. Elastomeric layer 14 may be of the same composition as, and may be unitary with photo-polymerizable layer 12. Backing layer 16 provides dimensional stability and may comprise any suitable material, such as a sheet of polyester, a sheet of metal, or the like.

A mask 20 is disposed on plate 10 between photo-polymerizable layer 12 and an ultraviolet light source 22. Mask 20 includes transparent areas 20A and opaque areas 20B. Light source 22 is typically a collimated light source. As shown in FIG. 1, light 23 from light source 22 passes through transparent areas 20A of mask 20 into photo-polymerizable layer 12. The ultraviolet light alters the material of photo-polymerizable layer 12. After the exposure, portions 12A of photo-polymerizable layer 12 are altered. Altered portions 12A of photo-polymer layer 12 should extend through the entire thickness of photo-polymer layer 12 to elastomer layer 14. Portions 12B of photo-polymer layer 12, which are not exposed to ultraviolet light because they are shaded by opaque areas 20B of mask 20 are not altered by the ultraviolet light.

As shown in FIG. 1, the boundaries between portions 12A and 12B are neither completely perpendicular to mask 20 nor parallel to the angle of incidence of light 23 from light source 22. These boundaries are inclined. Portions 12A are tapered in width with their deeper parts being wider than their parts near the surface of plate 10. This is because light from source 22 is never perfectly collimated. As the light passes through the thickness of photo-polymerizable layer 12 it spreads out. Furthermore, light which has entered photo-polymerizable layer 12 can be scattered so as to enter adjacent parts of portions 12A which are in the shadow of areas 20B.

Figure 6A:
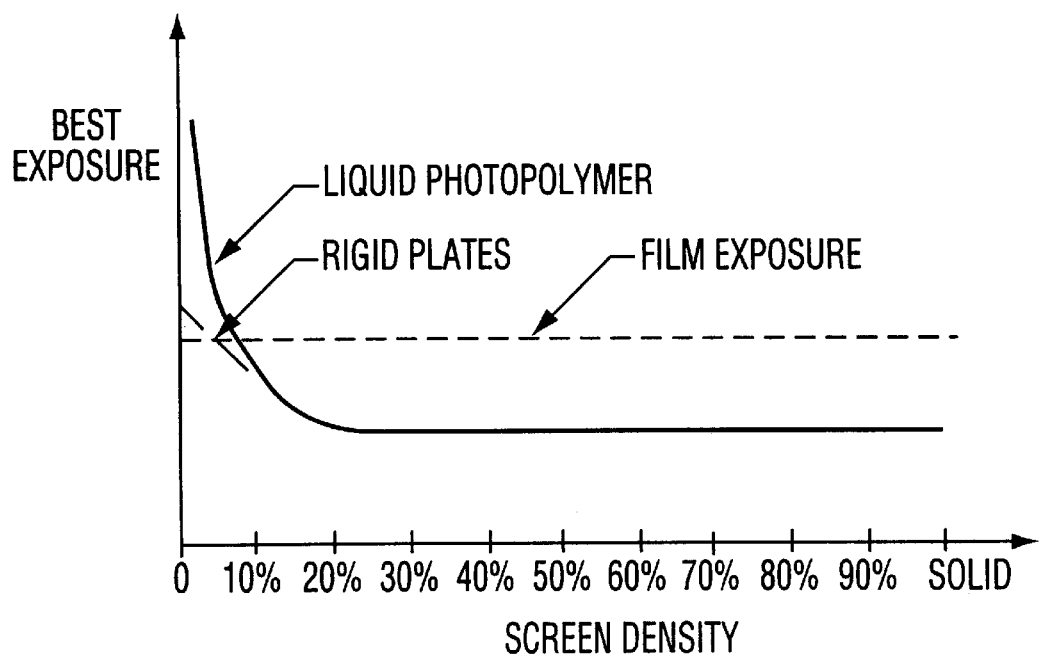

Light source 22 provides light 23 having an intensity which is essentially constant over the surface of mask 20. The amount of light per unit area falling on the surface of mask 20 is essentially constant. Properly exposing photo-polymerizable layer 12 requires a certain amount of light per unit volume. FIG. 6A is a plot of a curve 200 which illustrates desired exposure as a function of screen density for a typical flexographic printing plate. It can be seen that the best exposure is a compromise which slightly over exposes areas of the plate having higher screen densities and slightly underexposes areas having lower screen densities.

FIG. 1 shows a plate having a negative area 30 on its left hand side and a highlight 32 on its right hand side. The ratio of surface area of area 20A to the volume of exposed portion 12A in a highlight region 32 is less than it is in a negative region 30. Consequently, longer exposures are required in highlight regions than in negative regions. To limit the exposure in negative region 30 to an acceptable value, the prior art provides a piece of opaque material 34 and a skilled human operator. The human operator lays opaque material 34 on top of mask 20 during a portion of the exposure, thereby preventing highlight region 32 from becoming overexposed while allowing negative region 30 to obtain a sufficient exposure. The human operator must have significant skill to determine where, and for how long, to place the opaque material 34.

This Invention

Figure 2:
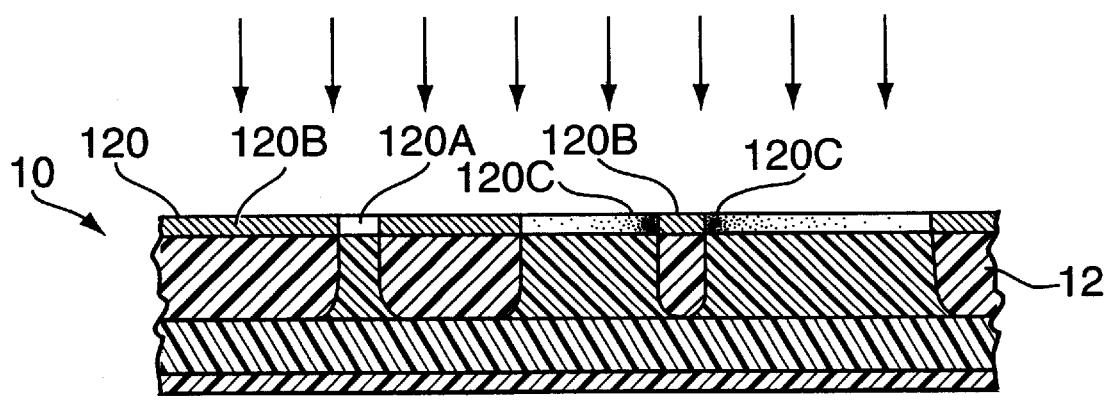
FIG. 2 is a section through a mask and printing plate for use in the method of the invention.

This invention provides a method for exposing a flexographic printing plate 10 which uses a mask 120 (FIG. 2) having a variable optical density. Mask 120 has opaque areas 120B as well as areas 120C which transmit only a portion of the light which hits them through to photo-polymer layer 12.

Mask 120 may be made by exposing and developing a suitable film. Areas 120B may be created in the film by exposing the film sufficiently to render the film opaque. Areas 120C may be partially absorbing areas created by exposing selected areas of the film to an exposure intermediate the exposure needed to cause mask 120 to be opaque and an exposure which would leave mask 120 clear.

In creating mask 120, the optical density in areas 120C is controlled to provide a mask 120 which, when evenly illuminated by light 23, will properly expose all areas of photo-polymer layer 12. The required optical density may be determined by modelling the photo-polymerization process to determine the ultraviolet exposure required by each part of photo-polymer layer 12. This may be done, for example, with commercially available computer software, such as PROLITH 3D available from Finle Technologies, Inc. of Austin Tex. Once the desired exposure is known then, for each non-opaque part of mask 120, one can readily calculate an optical density for areas 120C. The optical density is chosen so that each part of photo-polymer layer 12 will receive its optimum exposure when mask 120 is uniformly illuminated with ultraviolet light. In some cases this may result in a mask 120 having an optical density which gradually decreases with distance from a small opaque dot as shown, for example, in FIG. 2.

While it is desirable to do so, it is not necessary to use complicated models of the photo-polymerization process to practice the invention. The invention may be practised by determining an average screen density for each area of mask 120 and setting the optical density as a function of the screen density. The invention may also be practised by identifying negative areas in mask 120 and providing areas 120C which attenuate ultraviolet light by a constant factor within such negative areas. For example, the invention could be practised by providing areas 120C in negative areas which attenuate ultraviolet light by a factor of 2 to 3 times (so that the exposure in highlight areas is 100% to 300% greater than the exposure in negative areas). This produces significantly better results than are otherwise possible with a single exposure.

Mask 120 is preferably prepared by exposing a thermal film. Thermal films are films which are exposed by using heat rather than light. Some examples of suitable thermal films are Direct Digital Thermal Film available from Kodak Co. of Rochester N.Y., and Dry Silver Thermal Film available from Imation Enterprises Corp. of Oakdale Minn. These films, and other suitable thermal films, are capable of high sharpness and variable light absorbance.

In preferred embodiments of the method, the desired optical density of each small area on mask 120 is determined and then mask 120 is created by exposing a suitable film, preferably a thermal film, with a computer controlled laser. The laser is controlled to expose each small area on the film sufficiently to provide the desired optical density for that small area.

Mask 120 may be separate from plate 10 and held in alignment with plate 10 while photo-polymer layer 12 is exposed. In the preferred alternative, mask 120 is formed integrally with plate 10. A printing plate having an integral film is described, for example, in U.S. Pat. No. 5,262,275. Where mask 120 is integral with plate 10, mask 120 should be of a type which can be exposed without affecting polymer layer 12. For example, mask 120 may comprise a thermal film which can be exposed by causing localized heating with a laser operating at a wavelength which will not expose photo-polymer layer 12.

While it is preferable to use a single-layer thermal film to create a mask 120 for use with the invention, a mask 120 having variable light absorbance may be provided in various other ways. For example, mask 120 may be made by providing a two layer film having a "binary" layer consisting only of clear areas and opaque areas (as provided by the prior art) and a layer having a variable light absorbance. By way of example, the "binary" layer could comprise a thermal film or an ablative type film. The layer having a variable light absorbance could be provided by a silver halide film.

Figure 4:
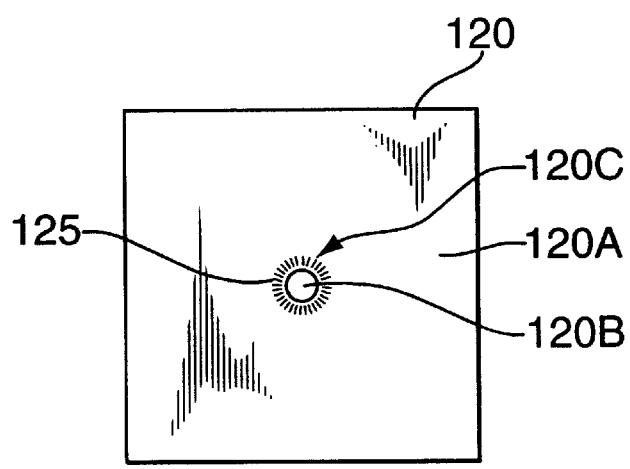
FIG. 4 is a top view of a mask for use in the invention which includes a partially light absorbing region generated by area modulation around a small dot.

As a further alternative, variable light absorption may be provided in mask 120 by creating in mask 120 an array of very small opaque features 125 as shown in FIG. 4. Features 125 are each too small to be resolved in the photo-polymerization process. Providing a pseudo-random dispersion of small features to yield a variable light absorbance is known in the art outside of the context of this invention and is sometimes called "area modulation". Providing a variable light absorbance by area modulation suffers from the disadvantage that the small features 125 must be very small (typically less than 10 microns). It is therefore necessary to use a very high resolution imaging system to prepare mask 120. High resolution imaging systems are becoming more readily available.

Providing a mask 120 wherein a variable optical density is achieved by area modulation may be advantageous in cases where it is desired to make mask 120 from a film which is not readily capable of providing a grey scale.

As a still further alternative, variable light absorption may be provided in mask 120 by making mask 120 from a film which can provide variable light absorbance and also adjusting the optical density of selected areas in the film by area modulation. For example, the invention may be practised with a film which can have 3 states, a maximum transmission state (e.g. clear) a minimum transmission state (e.g. opaque) and an intermediate state in which the film transmits for example, 25% of incident light. The three states could be created, for example, by exposing the film to zero, one or two exposures to a laser beam. The absorbance of a portion of the film which is in the intermediate state could be reduced by leaving a dispersion of tiny clear dots (tiny areas in the maximum transmission state) in that portion of the film. The absorbance of the area could also be increased by leaving a dispersion of tiny opaque dots (tiny areas in the minimum transmission state) in that portion of the film.

Figure 6B:
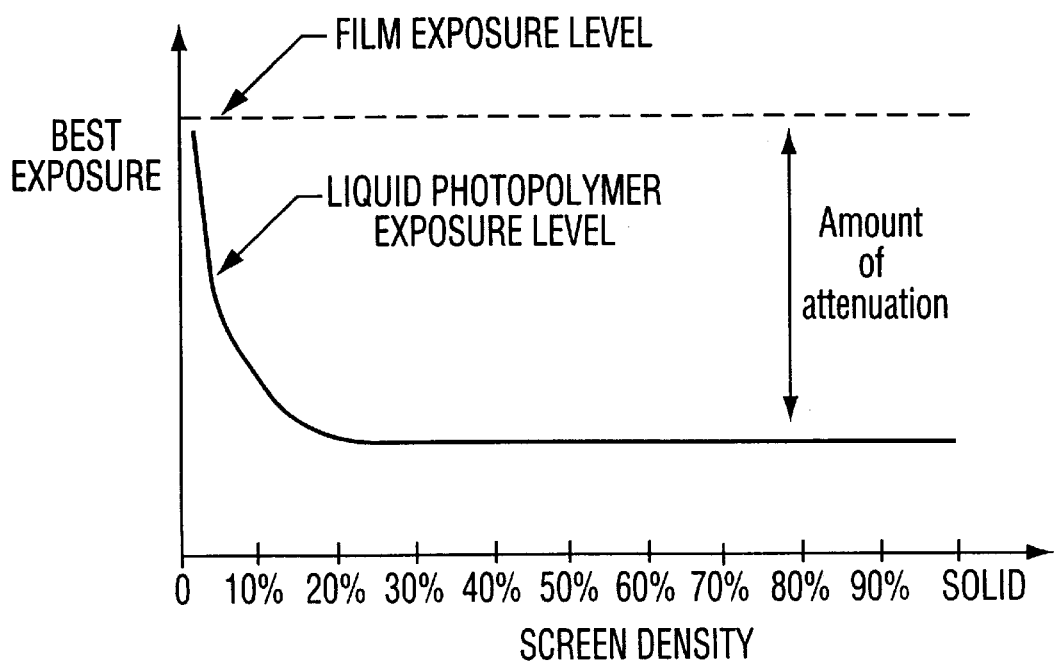

FIG. 6B illustrates the application of the invention. FIG. 6B is a plot of the curve 200 which illustrates the relationship between screen density and optimum exposure. As shown in FIG. 6B, the exposure level is set to be sufficient to properly expose areas of even the lowest screen densities in an image. Mask 120 provides an attenuation which varies as a function of the local screen density in an image being reproduced. The result is that light 23 is attenuated in intensity to the degree necessary to provide an optimum exposure to each area of the image. As a result, the exposure latitude can be significantly increased through use of the invention.

EXAMPLE 1

A liquid photo-polymer type flexographic plate, using F240 resin on a CSL exposure unit, both available from McDermid Co. of Wilmington, Del. was exposed through a mask made of Kodak Digital Thermal Film (sometimes also known as "Volcano" film available from Eastman-Kodak of Rochester New York. A standard flexographic test pattern which included lines and screens was imaged on the mask. The mask was imaged on a TRENDSETTER™ model 3244T available from Creo Products Inc. of Burnaby B.C. Canada in two passes. Each pass delivered an energy density of about 400 mJ/cm$^2$. In non-imaged areas the mask absorbed approximately 99.9% of incident ultraviolet light. In areas imaged by one pass the mask absorbed approximately 75% of incident ultraviolet light. Areas imaged in both passes absorbed less than 10% of incident ultraviolet light (i.e. they were effectively clear). The absorbance of those parts of the film imaged in one pass was further adjusted in the range of 75% absorption to 10% absorption by adding a pseudo-random stochastic screen using single pixel dots. The absorbance of the parts of the mask in the intermediate state was modified according to the screen density of the test pattern as set out in the following Table I.

TABLE I

| Screen Density (%) | Ultraviolet Absorbance (%) |
|---|---|
| 1 | 10 |
| 2 | 20 |
| 5 | 50 |
| 10 | 55 |
| 20 | 60 |
| 30 | 65 |
| 40 | 70 |
| 50 | 75 |
| 60 | 75 |
| 80 | 75 |
| 100 | 75 |

The mask and flexographic plate were placed in a flexographic exposure unit and exposed for 12 minutes. The exposed plate was developed and printed on a flexographic press. The plate showed superb resolution. All screens down to 1% were resolved as were positive and negative (inverse) lines.

COMPARATIVE EXAMPLE 2

The steps of Example 1 were repeated except that the mask used was a regular film having a halftone image but no intermediate absorbance areas. It was not possible to find an exposure capable of creating a printing plate capable of printing both the highlights and the negative lines. If a low exposure was used so that the negative lines were resolved the highlights were missing. If a greater exposure was used so that the highlights were properly exposed, the negative lines were missing.

Figure 3:
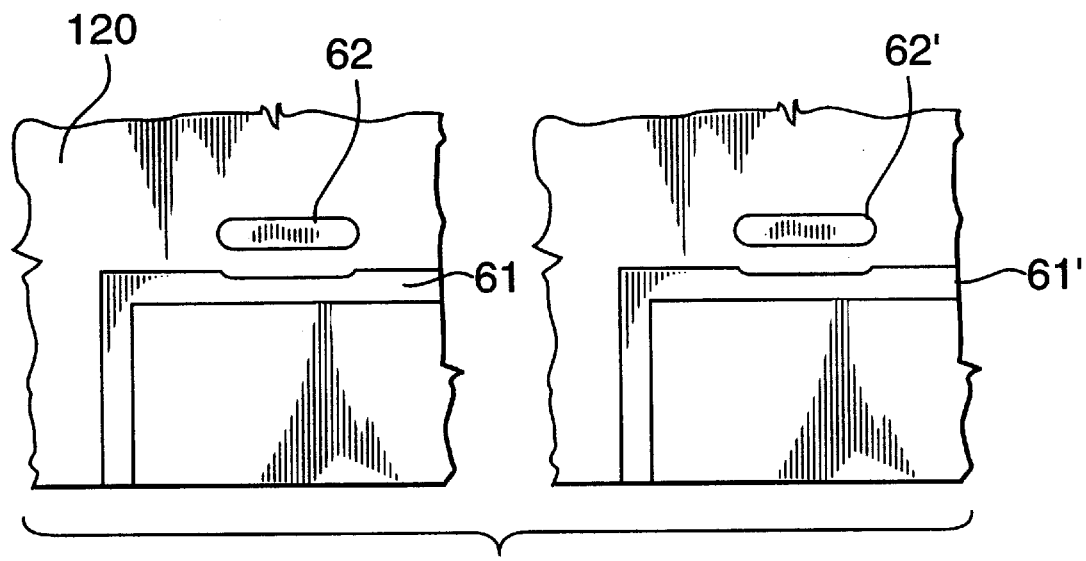
FIG. 3 is a top view of a mask for use in an embodiment of the invention which provides proximity correction.

Mask 120 may incorporate proximity correction in addition to the exposure correction described above. Proximity correction is a well known technique in the semiconductor processing field. Methods or proximity correction are described, for example, in the Spring 1996 issue of Microlithography World, which is incorporated herein by reference. Proximity correction involves distorting the boundaries between opaque and non-opaque regions of mask 120 to compensate for the fact that light passing through non-opaque parts of mask 120 can scatter and leak into parts of photo-polymer layer 12 which are under opaque areas on mask 120. For example, where mask 120 has non-opaque areas 61 and 62 in the form of closely spaced lines, as shown in the left hand side portion of FIG. 3, the width of non-opaque area 61 may be reduced to compensate for the fact that light from area 62 will leak into the portion of the photo-polymer layer under area 61, thereby causing increased exposure in the photo-polymer under and adjacent area 61. This, in turn, will cause a broadening of the line formed in photo-polymer layer 12 under area 61. With proper pre-distortion non-opaque areas 61 and 62 will yield lines 61' and 62' in photo-polymer 12 as shown in the right hand side portion of FIG. 3.

Leakage of light during exposure of photo-polymer 12 can also cause rounding of corners. Proximity correction preferably pre-distorts corners in the boundaries between opaque areas and non-opaque areas into sharper corners so that, after rounding caused by light leakage, the corners will have the desired sharpness. The PROLITH 3D software program, which is described above, can be used to determine how to pre-distort the boundaries between opaque regions and non-opaque regions in mask 120 to compensate for proximity effects. The invention may be used to create printing plates of particularly high quality by combining proximity correction with the exposure correction discussed above. Preferably the proximity correction step is performed first and then the proper exposures for the various regions within photo-polymer layer 12 are determined.

Figure 5:
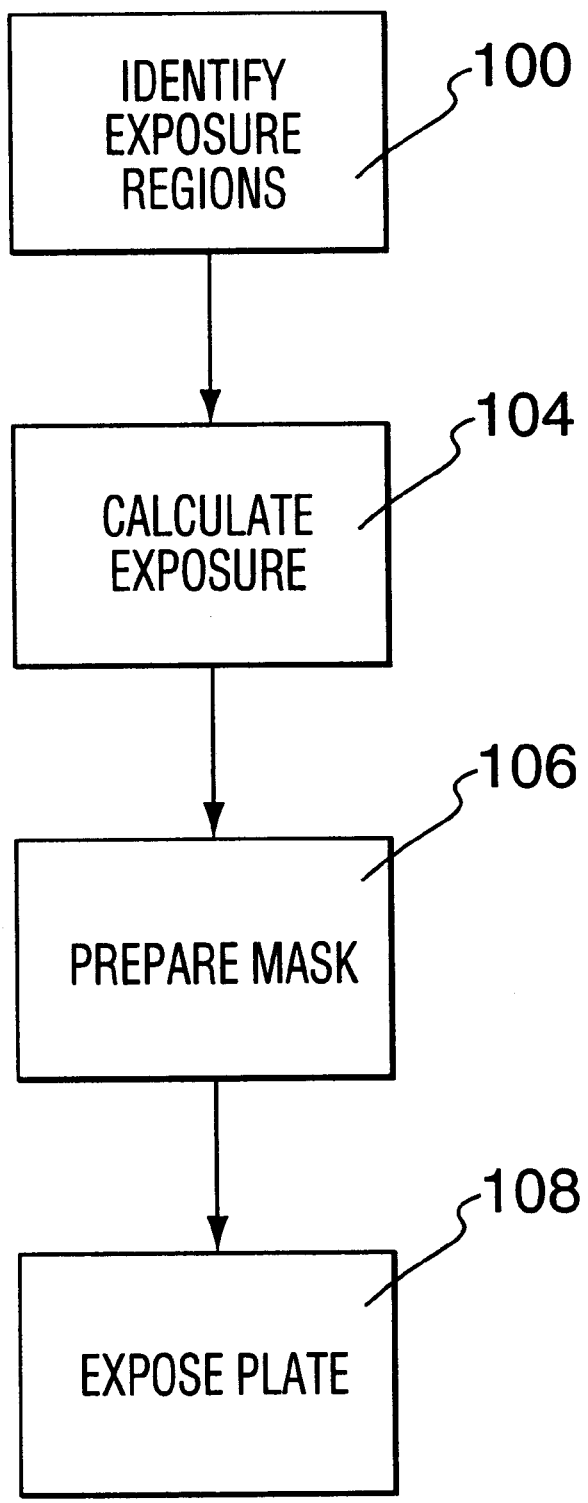
FIG. 5 is a flow chart illustrating a sequence of steps in the method of the invention; and, FIGS. 6A and 6B are curves illustrating the relationship between proper exposure and screen density for flexographic printing plates.

FIG. 5 illustrates steps in the method of the invention. The method begins by providing an image to be reproduced on a flexographic printing plate and identifying regions which require different exposures (step 100). This may be done, for example, by identifying regions within the image having screen densities falling within each of two or more ranges. Next, the exposure required by each of the different regions is calculated (step 104). Step 104 may include making a detailed calculation of exposure required by the region or, in the alternative, may include assigning an exposure to each region which is determined by, or looked up from, the range within which the screen density of the region falls. Example 1 above is an example of this alternative way to perform step 104.

In step 106 a mask is prepared. The mask includes opaque areas and non-opaque areas which correspond to the opaque and clear areas in a halftone image. In the mask, some of the non-opaque areas are made partially absorbing to ultraviolet light. The optical density of the non-opaque areas is varied. The optical density is greater in areas where a lower exposure is required. The optical density is less in areas where a higher exposure is required. Step 106 includes calculating the optical density required by each part of mask 120 and then creating a mask 120 having the required pattern of optical densities by one of the methods described above, or their equivalents.

Next, in step 108 the plate is exposed to ultraviolet radiation through mask 10. This step may be performed in a standard ultraviolet exposure device of the type used for exposing flexographic plates. The entire plate 10 can be exposed in a single exposure. The exposed plate can then be developed and used for printing in the conventional way.

The method avoids the need for pieces of opaque material 34 and does not require the exposure of plate 10 to be carried out by a skilled operator who has the skill and judgment necessary to decide where and when to apply pieces of opaque material 34 during exposure of photo-polymer layer 12. Since the exposure of negative areas is optimized, the "plugging" of small non-printing areas as a result of local overexposure is reduced and higher screen rulings may be used than would otherwise be easily possible.

As will be apparent to those skilled in the art in the light of the foregoing disclosure, many alterations and modifications are possible in the practice of this invention without departing from the spirit or scope thereof. For example, mask 120 may be any suitable mask which has suitable areas of variable density. Mask 120 is not limited to masks made from specific kinds of film.

Accordingly, the scope of the invention is to be construed in accordance with the substance defined by the following claims.

I claim:

1. A method for exposing a flexographic printing plate, the method comprising:
   a) providing an image to be reproduced by the printing plate;
   b) determining a first exposure to be given to first portions of the printing plate corresponding to a first area of the image and a second exposure, less than the first exposure, to be given to second portions of the printing plate corresponding to a second area of the image;
   c) creating a mask, the mask comprising opaque areas and non-opaque areas, the non-opaque areas of the mask having a first optical density in portions of the mask corresponding to the first area of the image and a second optical density, greater than the first optical density in portions of the printing plate corresponding to the second area of the image; and,
   d) exposing the printing plate to ultraviolet light through the mask.

2. The method of claim 1 wherein determining the first exposure comprises modelling a photo-polymer layer of the printing plate and computing an optimum exposure for the first portions of the printing plate.

3. The method of claim 1 wherein determining the first exposure comprises determining a screen density for the first area of the image and determining the first exposure from the screen density.

4. The method of claim 3 comprising determining the first exposure by selecting one of a plurality of ranges within which the screen density for the first area of the image falls and selecting a first exposure corresponding to the selected range.

5. The method of claim 1 wherein creating a mask comprises selectively locally heating a thermal film.

6. The method of claim 5 wherein exposing the thermal film comprises scanning laser across the film.

7. The method of claim 1 wherein creating the mask comprises providing a dispersion of features in non-opaque areas of the film, the features having dimensions smaller than a resolution of the printing plate.

8. The method of claim 1 wherein the first and second optical densities are provided by imparting an intermediate optical density to portions of the mask corresponding to the first and second areas of the image and providing the first optical density further comprises providing a dispersion of features in non-opaque areas of the film, the features having dimensions smaller than a resolution of the printing plate and an optical density less than the intermediate optical density.

9. The method of claim 1 further comprising pre-distorting boundaries between the opaque areas and the non-opaque areas of the mask to correct for proximity effects.

10. A method for exposing a flexographic printing plate, the method comprising:
   a) providing an image to be reproduced by the printing plate;
   b) determining a screen density of each part of the image;
   c) for each part of the image determining from the screen density an attenuation to be given to a corresponding part of a mask;
   d) creating a mask, the mask comprising opaque areas and non-opaque areas, the non-opaque areas of the mask providing the attenuation determined in step (c); and,
   e) exposing the printing plate to ultraviolet light through the mask.

11. The method of claim 10 wherein creating the mask comprises scanning a laser over a thermal film and delivering laser radiation to areas of the film.

12. The method of claim 11 wherein the mask comprises opaque areas, non-opaque areas having an intermediate optical density and non-opaque areas having a low optical density lower than the intermediate optical density.

13. The method of claim 12 comprising providing in portions of the mask having the intermediate optical density a dispersion of features having dimensions smaller than a resolution of the printing plate, the features having an optical density less than the intermediate optical density.

* * * * *